United States Patent
Peng et al.

(10) Patent No.: US 7,218,359 B2
(45) Date of Patent: May 15, 2007

(54) DIGITAL TELEVISION RECEIVER AND METHOD OF RECOVERING INCOMING DIGITAL TELEVISION SIGNAL

(75) Inventors: Bao-Chi Peng, Taipei (TW); Cheng-Yi Huang, I-Lan Hsien (TW); Wei-Ting Wang, Taipei (TW)

(73) Assignee: Realtek Semiconductor Corp., HsinChu (TW)

( * ) Notice: Subject to any disclaimer, the term of this patent is extended or adjusted under 35 U.S.C. 154(b) by 515 days.

(21) Appl. No.: 10/710,635

(22) Filed: Jul. 26, 2004

(65) Prior Publication Data

US 2006/0018409 A1  Jan. 26, 2006

(51) Int. Cl.
*H04N 5/44* (2006.01)
*H04N 5/50* (2006.01)
*H04L 27/00* (2006.01)
*H04B 1/06* (2006.01)

(52) U.S. Cl. .................. 348/731; 375/326; 455/258; 455/265; 348/725

(58) Field of Classification Search .............. 348/725, 348/726, 731, 732, 607; 375/326, 327; 455/255, 455/257–260, 182.2, 182.3, 180.3, 184.1
See application file for complete search history.

(56) References Cited

U.S. PATENT DOCUMENTS

| 5,805,242 | A | * | 9/1998 | Strolle et al. | 348/726 |
| 5,933,200 | A | * | 8/1999 | Han | 348/725 |
| 6,396,550 | B1 | * | 5/2002 | Oh | 348/735 |
| 6,438,177 | B1 | * | 8/2002 | Ikeda | 375/316 |
| 2003/0193365 | A1 | * | 10/2003 | Loheit et al. | 329/304 |

* cited by examiner

*Primary Examiner*—Victor R. Kostak
(74) *Attorney, Agent, or Firm*—Winston Hsu

(57) ABSTRACT

A digital television receiver includes a tuner for down-converting an incoming signal to produce a down-converted signal according to a local oscillator signal corresponding to a selected channel. A filter is coupled to the tuner for filtering the down-converted signal to produce an intermediate frequency (IF) signal. A carrier recovery unit is coupled to the filter for locking to a carrier frequency of the IF signal, and a pre-shift unit is coupled to the tuner. By shifting the local oscillator signal in a first direction by a predetermined first frequency shift in a first phase of carrier recovery, and then by shifting the local oscillator signal in a second direction by a second frequency shift in a second phase of carrier recovery, the pre-shift unit ensures a pilot tone of a selected channel is not filtered from the down-converted signal by the filter.

17 Claims, 5 Drawing Sheets

DIGITAL TELEVISION RECEIVER AND METHOD OF RECOVERING INCOMING DIGITAL TELEVISION SIGNAL

BACKGROUND OF INVENTION

1. Field of the Invention

The invention relates to electronic communications, and more particularly, to recovering a selected channel from an incoming Advanced Television Systems Committee (ATSC) digital television (DTV) signal.

2. Description of the Prior Art

Electronic communication and, in particular, techniques for broadcasting television video signals continue to be developed. Recently, the Advanced Television Systems Committee (ATSC) has introduced the Digital Television Standard. The resulting Digital Television (DTV) system described in the ATSC Digital Television Standard has ushered in a new era in television broadcasting. The impact of DTV is more significant than simply moving from an analog system to a digital system. Rather, DTV permits a level of flexibility wholly unattainable with analog broadcasting. An important element of this flexibility is the ability to expand system functions by building upon the technical foundations specified in ATSC standards such as the ATSC Digital Television Standard (A/53) and the Digital Audio Compression (AC-3) Standard (A/52).

Using conventional NTSC, and its PAL and SECAM counterparts, the video, audio, and some limited data information are conveyed by modulating an RF carrier in such a way that a receiver of relatively simple design can decode and reassemble the various elements of the signal to produce a program consisting of video and audio, and perhaps related data (e.g., closed captioning). As such, a complete program is transmitted by the broadcaster that is essentially in finished form. In the DTV system, however, additional levels of processing are required after the receiver demodulates the RF signal. The receiver processes the digital bit stream extracted from the received signal to yield a collection of program elements (video, audio, and/or data) that match the service(s) that the consumer selected. This selection is made using system and service information that is also transmitted. Audio and video are delivered in digitally compressed form and must be decoded for presentation.

The RF transmission subsystems used in DTV are designed specifically for terrestrial and cable applications. The structure is such that the video audio, and service multiplex/transport subsystems are useful in other applications. In RF transmission, the channel coder takes the digital bit stream and adds additional information that can be used by the receiver to reconstruct the data from the received signal which, due to transmission impairments, may not accurately represent the transmitted signal. The modulation subsystem offers two modes being based on vestigial sideband (VBS) modulation: an 8-VSB mode for terrestrial broadcast, and a 16-VSB mode for high data rates such as cable applications.

FIG. 1 shows a diagram illustrating the nominal VSB channel occupancy of an ATSC DTV signal. The 8-VSB terrestrial broadcast mode is optimized for maximum service area and provides a data payload of 19.4 Mbps in a 6 MHz channel. The 16-VSB high data rate mode, which provides twice the data rate at the cost of reduced robustness for channel degradations such a noise and multipath, provides a data payload of 38.8 Mbps in the single 6 MHz channel. Both modes provide a nominal DTV pilot tone located 310 kHz above the lower channel edge. For example, on channel 45 (656–662 MHz), the nominal pilot tone frequency is 656.310 Mhz. In a DTV transmitter, a modulation unit (or physical layer) uses digital bit stream information to modulate a carrier for the transmitted signal. The DTV receiver must recover this modulated carrier in order to lock to the corresponding 6 MHz channel.

FIG. 2 shows a block diagram of a tuner, intermediate frequency amplifier, and FPLL in the prototype VSB receiver 200 described in the Guide to Use of the ATSC DTV Standard. The operation of the receiver 200 is described in detail on page 88 of the Guide to Use of the ATSC DTV Standard, 4 Dec. 2003, and more specifically, in U.S. Pat. No. 4,072,909, disclosed by Citta and issued on 7 Feb. 1978, which are included herein by reference. As shown in FIG. 2 and described in the above-mentioned documents, the prototype receiver 200 uses pilot carrier components in both the in-phase I and quadrature-phase Q baseband DTV signals for controlling carrier recovery.

When recovering information from a selected channel, the synthesizer 204 generates a reference signal 206, which is mixed in the tuner 208 with the incoming signal S to produce a down-converted signal 210. Theoretically, the SAW filter 202 has an in-band frequency range which perfectly corresponds with the down-converted channel occupancy of an ATSC DTV signal shown in FIG. 1. However, in actual implementations, there are often differences between reference signal frequencies. Therefore, the down-converted channel may be shifted and partially filtered by the SAW filter 202. If the DTV pilot tone located 310 kHz above the lower channel edge is filtered away by the SAW filter 202, the prototype VSB receiver 200 is unable to lock to the channel and recover information from the selected channel.

SUMMARY OF INVENTION

One objective of the claimed invention is therefore to provide a digital television receiver capable of pre-shifting a local oscillator signal of the tuner, to ensure a pilot tone of a selected channel is not filtered from the down-converted signal by the SAW filter and thereby solve the above-mentioned problem.

According to an exemplary embodiment of the claimed invention, a digital television receiver is disclosed comprising a tuner for down-converting an incoming signal to produce a down-converted signal according to a local oscillator signal corresponding to a selected channel; a filter coupled to the tuner for filtering the down-converted signal to produce an intermediate frequency (IF) signal; a carrier recovery unit coupled to the filter for locking to a carrier frequency of the IF signal; and a pre-shift unit coupled to the tuner for shifting the local oscillator signal in a first direction by a predetermined first frequency shift in a first phase of carrier recovery, and then for shifting the local oscillator signal in a second direction by a second frequency shift in a second phase of carrier recovery.

According to another exemplary embodiment of the claimed invention, a method is disclosed for recovering an incoming digital television signal. The method comprises down-converting the incoming digital television signal to produce an down-converted signal according to a local oscillator signal corresponding to a selected channel; filtering the down-converted signal to produce an intermediate frequency (IF) signal; in a first phase of carrier recovery, shifting the local oscillator signal in a first direction by a predetermined first frequency shift; locking to a carrier frequency of the IF signal utilizing a carrier recovery unit;

and in a second phase of carrier recovery, shifting the local oscillator signal in a second direction by a second frequency shift.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
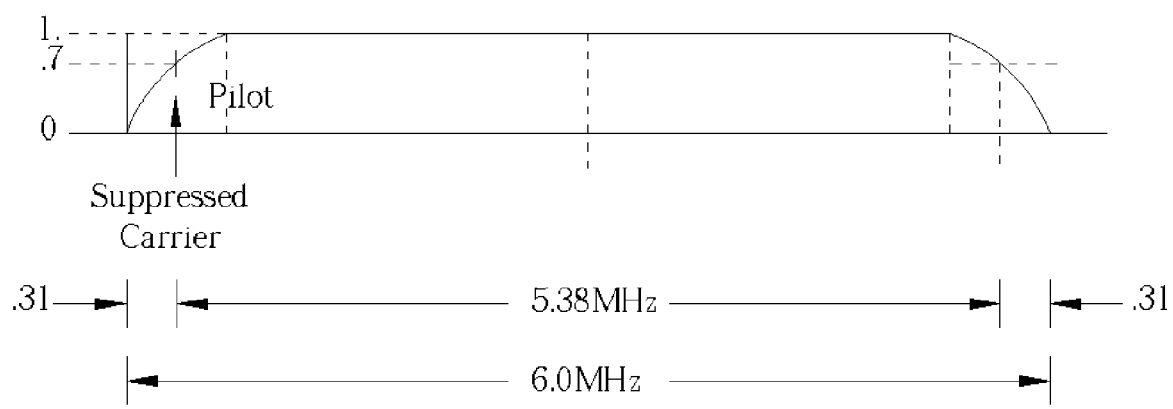
FIG. 1 shows a diagram illustrating the nominal VSB channel occupancy of an ATSC DTV signal.
Figure 2:
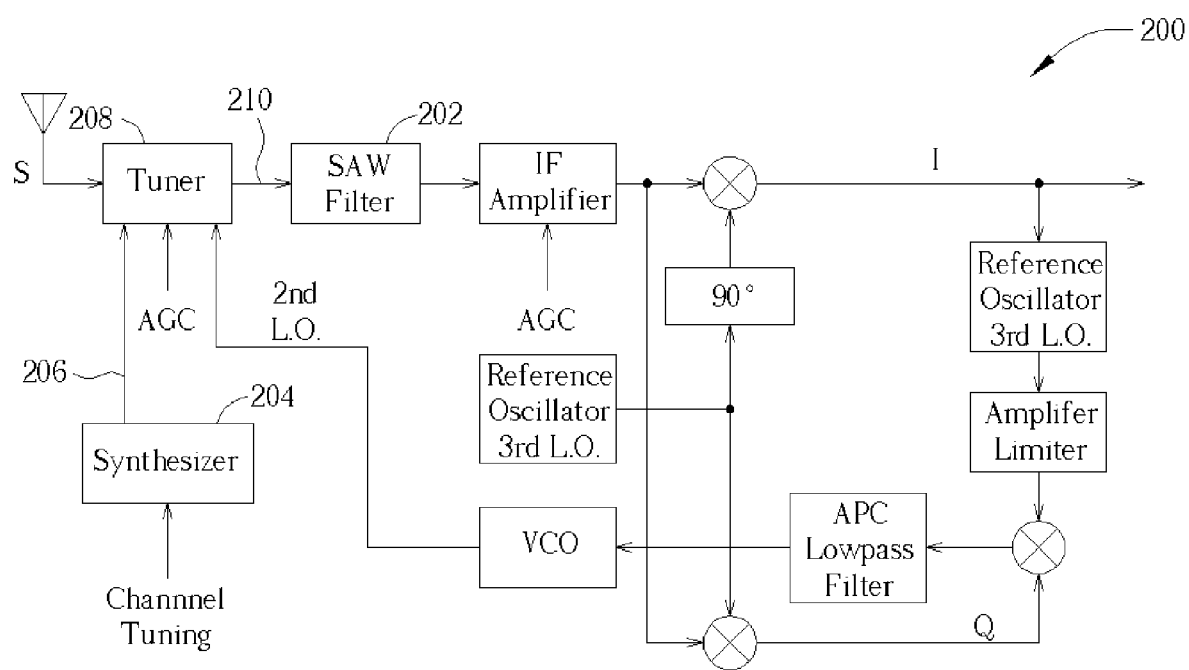
FIG. 2 shows a block diagram of a tuner, intermediate frequency amplifier, and FPLL in the prototype VSB receiver according to the prior art.
Figure 3:
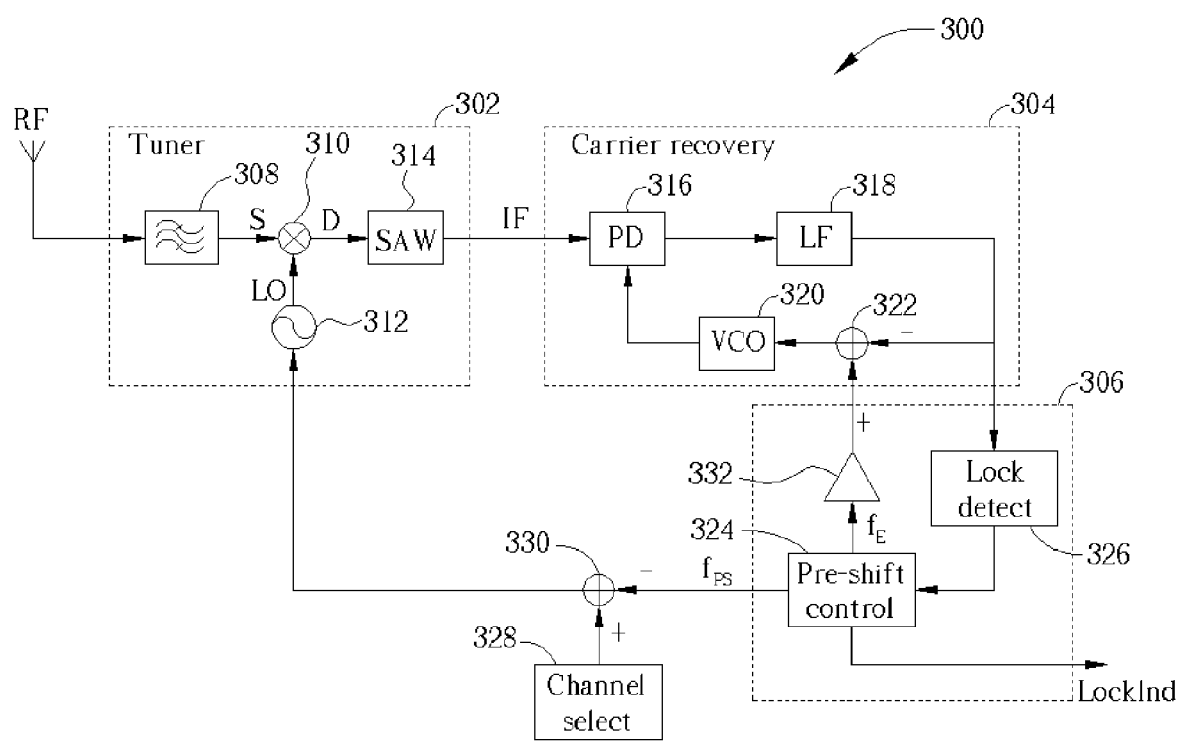
FIG. 3 shows a digital television (DTV) receiver according to an exemplary embodiment of the present invention.

FIG. 3 shows a digital television (DTV) receiver 300 according to an exemplary embodiment of the present invention. The digital television (DTV) receiver 300 includes a tuner 302, a carrier recovery unit 304, a channel selector 328 and a pre-shift unit 306. The tuner includes an RF filter 308, a mixer block 310, a local oscillator (LO) 312, and a surface acoustic wave (SAW) filter 314. The carrier recovery unit 304 has a phase locked loop (PLL) configuration and includes a phase detector (PD) 316, a low-pass filter (LF) 318, a voltage controlled oscillator (VCO) 320, and an adder 322. The pre-shift unit 306 includes a pre-shift controller 324 and a lock detector 326.

A received RF signal is input to the tuner 302 and filtered by the RF filter 308 to produce an incoming signal S. The incoming signal S is mixed with a local oscillator (LO) signal by the mixer unit 310 to generate a down-converted signal D. The value of the LO signal corresponds to a selected DTV channel chosen by the channel selector 328 and a shifting signal $f_{PS}$ outputted by the pre-shift unit 308, which are added together at adder 330. The down-converted signal D is filtered by the SAW filter 314 and the resulting intermediate frequency (IF) signal is passed to the carrier recovery unit 304. The carrier recovery unit 304 locks to a carrier frequency of the IF signal.

Figure 4:
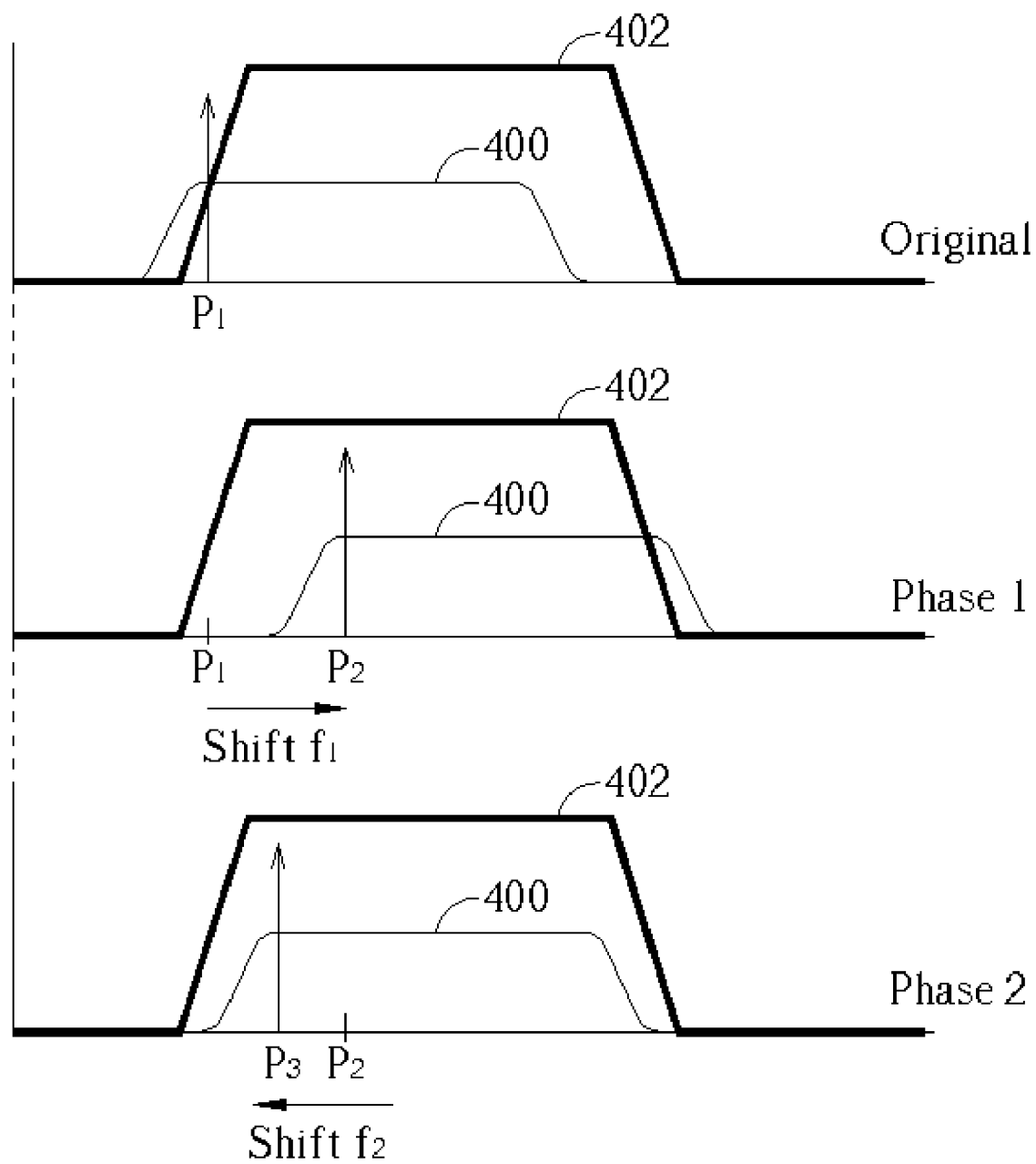
FIG. 4 shows frequency shifts made by the pre-shift unit to the selected channel in the down-converted signal with respect to the fixed in-band frequency range of the SAW filter shown in FIG. 3.

FIG. 4 shows frequency shifts made by the pre-shift unit 306 to the selected channel 400 in the down-converted signal D with respect to the fixed in-band frequency range 402 of the SAW filter 314. As shown in FIG. 4, originally, the down-converted signal D is offset with respect to the in-band frequency range 402 of the SAW filter 314. For example, a reference frequency in a DTV transmitter that generated the received RF signal may be different than the LO signal generated by the local oscillator 312, and this situation could cause the selected channel 400 to be shifted in the down-converted signal D. This offset has caused the pilot tone of the selected channel 400 to be positioned at a position P1, which is no longer within the in-band frequency range 402 of the SAW filter 314.

In a first phase of carrier recovery, the pre-shift unit 306 outputs a value of the shifting signal $f_{PS}$ to cause the selected channel 400 in the down-converted signal D to be shifted by a predetermined first frequency shift $f_1$ such as 500 kHz. As shown in FIG. 4, the first frequency shift $f_1$ moves the selected channel 400 to a higher frequency and thereby shifts the pilot tone of the selected channel 400 to a position P2, which is within the in-band range 402 of the SAW filter 316. Because the pilot tone of the selected channel 400 is no longer filtered by the SAW filter 316, the carrier recovery unit 304 is successfully able to use the pilot tone to lock to the carrier frequency of the selected channel 400.

In a second phase of carrier recovery, the pre-shift unit outputs a value of the shifting signal $f_{PS}$ to cause the selected channel 400 in the down-converted signal D to be shifted back by a second frequency shift $f_2$. The second frequency shift $f_2$ positions the pilot tone of the selected channel 400 at a lower edge of the in-band frequency range 402 of the SAW filter 314, which ensures that the entire bandwidth of the selected channel 400 is within the in-band range 402 of the SAW filter 314. In this way, the carrier recovery unit 304 can use the pilot tone to lock to the carrier frequency of the selected channel 400, and the DTV receiver 300 can recover information of the selected channel 400.

For example, in one embodiment of the present invention, the second frequency shift f2 is determined during the first phase of carrier recovery. More specifically, in the first phase of carrier recovery, the lock detector 326 determines whether or not the carrier recovery unit 304 has locked to the carrier of the IF signal. When the carrier recovery unit 304 has locked to the carrier of the IF signal, the second frequency shift $f_2$ is calculated as the difference between a predetermined center frequency of the VCO 320 and the locked frequency of the VCO 320. The predetermined center frequency of the VCO 320 corresponds to the expected frequency of the VCO if the selected IF signal is not offset. After the second frequency shift f2 has been calculated, the pre-shift unit transitions from the first phase to the second phase of carrier recovery.

Figure 5:
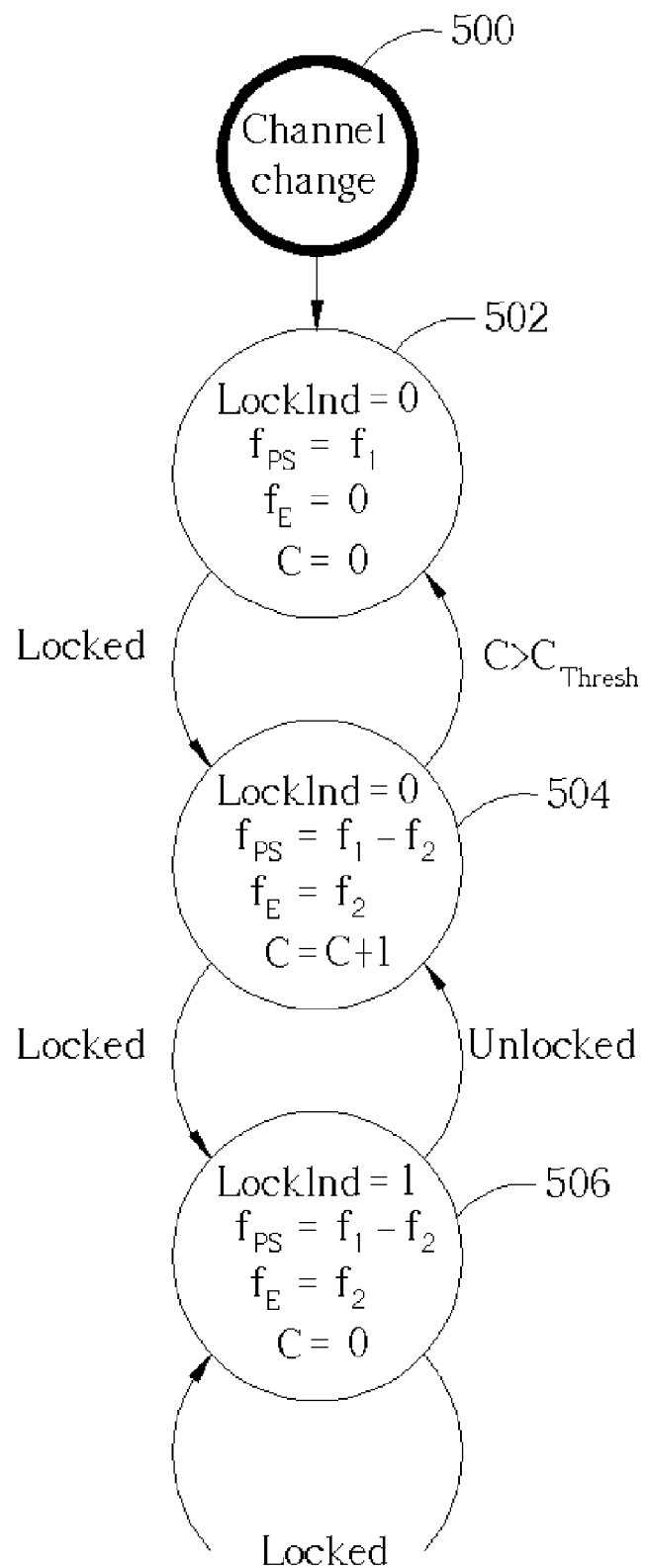
FIG. 5 shows a state diagram of the pre-shift controller of FIG. 3.

FIG. 5 shows an example state diagram of the pre-shift controller 324 of FIG. 3. The state diagram comprises the following three states:

State 500: When a new channel is selected, the channel selector 328 outputs a control signal to the local oscillator 312 corresponding to the selected channel, and the state diagram proceeds to the first phase of carrier recover at state 502.

State 502: In state 502, referred to as the first phase of carrier recovery, Phase 1 in FIG. 4, the pre-shift control unit 324 outputs the predetermined $f_{PS}$ value. This corresponds to the predetermined first frequency shift $f_1$ (such as 500 kHz) shown in FIG. 4 and results in an increase shift in frequency in the amount $f_1$ of the down-converted signal D going into the SAW filter 314. When the lock detector 326 determines that the carrier recovery unit 304 has locked to the carrier of the IF signal, the difference of the predetermined center frequency of the VCO 320 and the currently locked frequency of the VCO 320 is passed to the pre-shift control unit 324 by the lock detector 306. The state diagram then proceeds to the second phase of carrier recovery at state 504.

State 504: In state 504, referred to as the second phase of carrier recovery, Phase 2 in FIG. 4, the pre-shift control unit 324 shifts back the predetermined $f_{PS}$ value outputted in state 502 by an amount corresponding to the frequency difference of the predetermined center frequency of the VCO 320 and the locked frequency of the VCO 320 passed to the pre-shift control unit 324 in state 502. This corresponds to the second frequency shift $f_2$ shown in FIG. 4 and results in a decrease shift in frequency in the amount $f_2$ of the down-converted signal D going into the SAW filter 314. When the lock detector 326 determines that the carrier recovery unit 304 has again locked to the carrier of the IF signal, the state diagram proceeds to normal operations at state 506. In the event that lock is not achieved within a predetermined time (i.e., if a counter C exceeds a predetermined threshold $C_{Thresh}$), the state diagram returns to the first phase of carrier recover at state 502.

State 506: Carrier recover is complete and the pre-shift controller asserts a lock indicator signal LockInd to indicate that information recovery of the selected channel can begin.

In another embodiment of the present invention, to improve the locking time of the carrier recovery unit 304 in the second phase of carrier recovery, in state 504, the pre-shift control unit outputs a PLL adjustment signal $f_E$, which is buffered by a constant at buffer 332 and corresponds to the second frequency shift $f_2$. In this way, the locked frequency of the PLL will already be compensated by the amount $f_2$ when the pre-shift controller enters the second phase of carrier recovery at state 504. Therefore, the carrier recovery unit 304 can maintain lock (or very quickly obtain lock) in the second phase of carrier recovery (state 504). As shown in FIG. 5, in this embodiment, the $f_E$ signal is set to a predetermined value of zero in state 502.

It should also be noted that other embodiments are also possible. For example, the channel selection operation performed at state 500 can be combined with the first phase of frequency recovery at state 502. In other words, the pre-shifting unit 306 can be implemented within the channel selection block, which includes the predetermined frequency shift $f_1$ in the channel selection signal outputted by the channel selection block. In this way, states 500 and 502 can be combined in the first phase of carrier recovery.

The skilled in the art will readily observe that numerous modifications and alterations of the device may be made while retaining the teachings of the invention. Accordingly, the above disclosure should be construed as limited only by the metes and bounds of the appended claims.

What is claimed is:

1. A receiver comprising:
  a tuner for down-converting an incoming signal to produce a down-converted signal according to a local oscillator signal corresponding to a selected channel;
  a filter coupled to the tuner for filtering the down-converted signal to produce an intermediate frequency (IF) signal;
  a carrier recovery unit coupled to the filter for locking to a carrier frequency of the IF signal; and
  a pre-shift unit coupled to the tuner for shifting the local oscillator signal in a first direction by a predetermined first frequency shift in a first phase of carrier recovery, and then for shifting the local oscillator signal in a second direction by a second frequency shift in a second phase of carrier recovery.

2. The receiver of claim 1, wherein the first direction is an increase in frequency and the second direction is a decrease in frequency.

3. The receiver of claim 1, wherein the filter is a surface acoustic wave (SAW) filter.

4. The receiver of claim 1, further comprising:
  a lock detector coupled to the carrier recovery unit and the pre-shift unit for determining whether or not the carrier recovery unit has locked to the carrier of the IF signal;
  wherein the pre-shift unit transitions from the first phase to the second phase of carrier recovery after the lock detector determines the carrier recovery unit has locked to the carrier of the IF signal.

5. The receiver of claim 4, wherein the pre-shift unit transitions from the second phase to the first phase of carrier recovery if the lock detector does not within a predetermined time period determine that the carrier recovery unit has locked to the carrier of the IF signal.

6. The receiver of claim 4, wherein the carrier recovery unit has a phase locked loop (PLL) structure comprising a voltage controlled oscillator (VCO); wherein the second frequency shift is the difference between a predetermined center frequency of the VCO and a locked frequency of the VCO in the first phase of carrier recovery when the lock detector determines the carrier recovery unit has locked to the carrier of the IF signal.

7. The receiver of claim 6, wherein the pre-shift unit shifts the VCO in the second direction by a predetermined third frequency shift in the first phase of carrier recovery, and then shifts the VCO in the first direction by a fourth frequency shift in the second phase of carrier recovery.

8. The receiver of claim 7, wherein the predetermined third frequency shift is substantially zero, and the fourth frequency shift is substantially equal to the second frequency shift.

9. The receiver of claim 1, wherein during the second phase of carrier recovery, the pre-shift unit shifts the local oscillator signal in the second direction by the second frequency shift to position a pilot tone of the selected channel at a lower edge of an in-band range of the filter.

10. The receiver of claim 1, wherein the receiver is an Advanced Television Systems Committee (ATSC) digital television (DTV) receiver.

11. A method of recovering an incoming signal, the method comprising:
  down-converting the incoming signal to produce an down-converted signal according to a local oscillator signal corresponding to a selected channel;
  filtering the down-converted signal to produce an intermediate frequency (IF) signal;
  in a first phase of carrier recovery, shifting the local oscillator signal in a first direction by a predetermined first frequency shift;
  locking to a carrier frequency of the IF signal; and
  in a second phase of carrier recovery, shifting the local oscillator signal in a second direction by a second frequency shift.

12. The method of claim 11, wherein the first direction is an increase in frequency and the second direction is a decrease in frequency.

13. The method of claim 11, further comprising:
  determining whether or not the carrier of the IF signal has been locked; and
  transitioning from the first phase to the second phase of carrier recovery after the carrier of the IF signal has been locked.

14. The method of claim 13, further comprising transitioning from the second phase to the first phase of carrier recovery if the carrier of the IF signal has not been locked within a predetermined time period.

15. The method of claim 11, wherein the second frequency shift is the difference between a predetermined center frequency and a locked frequency in the first phase of carrier recovery when the carrier of the IF signal has been locked.

16. The method of claim 11, wherein during the second phase of carrier recovery, shifting the local oscillator signal in the second direction by the second frequency shift positions a pilot tone of the selected channel at a lower edge of an in-band range of the filter.

17. The method of claim 11, wherein the incoming signal is an Advanced Television Systems Committee (ATSC) digital television (DTV) signal.

* * * * *